(12) United States Patent
Canova

(10) Patent No.: US 6,858,806 B2
(45) Date of Patent: Feb. 22, 2005

(54) PROCESS FOR PRODUCING PRINTED CIRCUITS AND PRINTED CIRCUITS THUS OBTAINED

(75) Inventor: Antonio Canova, Montevarchi (IT)

(73) Assignee: Magnetik S.p.A., Arezzo (IT)

( * ) Notice: Subject to any disclaimer, the term of this patent is extended or adjusted under 35 U.S.C. 154(b) by 210 days.

(21) Appl. No.: 10/043,002

(22) Filed: Jan. 9, 2002

(65) Prior Publication Data

US 2002/0056571 A1 May 16, 2002

Related U.S. Application Data

(62) Division of application No. 09/374,971, filed on Aug. 16, 1999, which is a continuation of application No. PCT/IT98/00026, filed on Feb. 16, 1998.

(30) Foreign Application Priority Data

Feb. 17, 1997 (IT) .......................................... FI97A0123

(51) Int. Cl.[7] ................................................ H05K 1/00
(52) U.S. Cl. ...................................... 174/250; 174/261
(58) Field of Search ............................... 174/254, 261, 174/250, 255; 361/749–751

(56) References Cited

U.S. PATENT DOCUMENTS

| | | |
|---|---|---|
| 4,617,729 A | 10/1986 | Celnik |
| 4,873,764 A | 10/1989 | Grimm |
| 4,875,285 A | 10/1989 | Haan et al. |
| 4,934,578 A | 6/1990 | Fritsch |
| 4,948,026 A | 8/1990 | Fritsch |
| 4,982,376 A | 1/1991 | Megens et al. |
| 5,084,961 A | 2/1992 | Yoshikawa |
| 5,105,532 A | 4/1992 | Fritsch |
| 5,157,734 A | 10/1992 | Chen et al. |
| 5,195,154 A | 3/1993 | Uchida |
| 5,220,724 A | 6/1993 | Gerstner |
| 5,250,469 A | 10/1993 | Tanaka et al. |
| 5,258,738 A | 11/1993 | Schat |
| 5,321,885 A | 6/1994 | Hino et al. |
| 5,323,528 A | 6/1994 | Baker |
| 5,349,504 A | 9/1994 | Simms et al. |

(List continued on next page.)

OTHER PUBLICATIONS

Circuit Board Soldering Through Conformal Coating, Research Disclosure, Sep. 1988, No. 293, Kenneth Mason Publications.
PCT International Application (France), International Publicaton No. WO 95/13632 published May 18, 1995.
Patent Abstract of Japan, vol. 14, No 99 (E–0893), Feb. 22, 1990 regarding Publication No. 01303793 published Jul. 12, 1989.
Patent Abstracts of Japan, volume and number unknown, regarding Japanese Abstract Publication No. 06196851 published Jul. 15, 1994.
R. Keller; "Insights and observations on mixed–technology assembly" Electronic Packaging and Production., vol. 28 No 4, Apr. 1988, Massachusetts, pp. 34–37, XPO00140055.
German Patent No. DE 44 25 803 A 1 issued Jul. 21, 1994.

*Primary Examiner*—Evan Pert
*Assistant Examiner*—Jeremy Norris
(74) *Attorney, Agent, or Firm*—Waddey & Patterson; Mark J. Patterson

(57) ABSTRACT

There is described a process for producing printed circuits comprising a laminar support, an electrically conductive track on the laminar support, and an auxiliary conductive element soldered to the conductive track. There is a provision to apply the auxiliary conductive element by means of an apparatus for applying SMD components.

12 Claims, 3 Drawing Sheets

U.S. PATENT DOCUMENTS

| | | | |
|---|---|---|---|
| 5,373,111 A | * 12/1994 | McClure et al. | 174/250 |
| 5,377,405 A | 1/1995 | Sakurai et al. | |
| 5,410,801 A | 5/1995 | Shiloh et al. | |
| 5,413,275 A | 5/1995 | Verguld et al. | |
| 5,461,202 A | * 10/1995 | Sera et al. | 174/254 |
| 5,498,575 A | 3/1996 | Onishi et al. | |
| 5,563,572 A | 10/1996 | Hetzler | |
| 5,659,947 A | 8/1997 | Eilers et al. | |
| 5,683,566 A | 11/1997 | Hetzler | |
| 5,699,611 A | 12/1997 | Kurogi et al. | |
| 5,729,896 A | 3/1998 | Dalal et al. | |
| 5,896,081 A | 4/1999 | Tzeng et al. | |
| 5,974,661 A | 11/1999 | Neuhalfen | |
| 6,108,210 A | * 8/2000 | Chung | 361/747 |
| 6,151,771 A | 11/2000 | Tzeng et al. | |
| 6,323,440 B1 | * 11/2001 | Maruyama et al. | 174/262 |
| 6,350,957 B1 | * 2/2002 | Shingai et al. | 174/254 |
| 6,457,234 B1 | * 10/2002 | Edelstein et al. | 29/843 |

\* cited by examiner

PROCESS FOR PRODUCING PRINTED CIRCUITS AND PRINTED CIRCUITS THUS OBTAINED

This application is a divisional of co-pending U.S. patent application Ser. No. 09/374,971 filed Aug. 16, 1999, entitled "Process for Producing Printed Circuits and Printed Circuits Thus Obtained" which is a continuation of PCT Application No. PCT/IT98/0026 filed Aug. 16, 1999, entitled "Process for Producing Printed Circuits and Printed Circuits thus Obtained" which claims priority from Italian Application No. FI97A000023, filed Feb. 17, 1997. These references are hereby incorporated by reference.

BACKGROUND OF THE INVENTION

The present invention relates to a process for producing printed circuits comprising a laminar support or board, on which is produced a plurality of electrically conductive tracks for connecting a plurality of electronic components. More particularly this invention relates to a novel technique for applying auxiliary conductive elements to the laminar support board, having the objective of increasing the conductivity of the tracks at specified points in the circuit, where the power components are located. The invention also relates to a printed circuit obtained by this novel process as well as to a loader of auxiliary conductive elements which is produced so as to be used with a process according to the invention.

State of The Art

The prior art teaches the producing electronic circuits with laminar supports or boards produced from "vetronite" or equivalent materials. The boards include, on one or both faces, one or more tracks of conductive material. Copper is a typical material for these tracks. These tracks are constructed by depositing a lamina of copper or equivalent material on the face of the laminar support and then carrying out a printing and etching procedure. Once the tracks have been constructed, components are added to the board. These electronic circuit components include both power components and logic components. Power components are generally characterised by their high power consumption and logic components are associated with low consumption. Both types of components are applied to the tracks produced on the board. The cross-section of the various conductive tracks is varied by the design architect in accordance with the amount of power consumed by the individual electronic components and the associated space available on the board. In this manner, the design can offer sufficiently limited resistance and avoid excessive heating. The cross-section can be increased by increasing the thickness of the copper lamina applied to the laminar support, or by increasing the width of the track. However, both of the dimensions of the transverse cross-section of a track cannot be increased at will for several reasons. As far as the thickness is concerned, since all the tracks are produced from the same conductive lamina, the latter must not be too thick so as not to increase the cost of the circuit beyond certain limits. Consequently it is important not to over-dimension the thickness of the tracks dedicated to the logic components in order to have sufficient conductivity in the tracks dedicated to the power components. Moreover, it is necessary to avoid the effects of the under-etching. This occurs where the conductive lamina from which the conductive tracks of the circuit are made is of great thickness. The width of the track is limited by the circuit layout and the spatial requirements for the board.

To obviate the design requirement limitations and drawbacks, the prior art also teaches the manually application of auxiliary conductive strips, consisting of copper slugs, which are soldered to the tracks. This is used for providing the power flow necessary for the high consumption of the power components connected to the board. The application of these auxiliary conductive strips currently requires an appreciable input of manual labour. The prior art teaches that each conductive strip is produced in a manner including shape, thickness, and other dimensions that are dedicated to the specific application. These conductive strips are soldered manually to the points at which an increase in the cross-section of the conductive track is required on account of the presence of power elements.

SUMMARY OF THE INVENTION

The objective of the present invention is the provision of a process for mounting auxiliary conductive elements on printed circuits, which is simpler, more economical and faster than the conventional systems.

Within the scope of this general objective, a particular objective of the present invention is the provision of a process which can be carried out using currently known machines and apparatus for mounting electronic components on printed boards.

A further objective of the present invention is the provision of a process which allows simple and economical production of printed circuits of different types without the necessity of dimensioning the auxiliary conductive elements in a specific and dedicated manner for each individual circuit.

A further objective of the present invention is the provision of a printed circuit with auxiliary conductive elements which is cheaper and simpler than conventional circuits.

These and further objectives and advantages, which will become clearly apparent to those skilled in the art from reading the following text, are achieved in substance by providing for the auxiliary conductive elements to be applied to the laminar support by means of an apparatus for applying SMD (Surface Mounted Device) technology components.

The invention is therefore based on the idea of manipulating the auxiliary conductive elements as if they were normal SMD technology electronic components. This allows mounting to be enormously simplified since the auxiliary conductive elements are also applied by the automatic machines in the same phase of application of the SMD components.

In practice, the process according to the invention can exhibit the following phases: producing at least one conductive track on the laminar support; applying a so-called "solder-resist" protective layer to the laminar support, leaving on the conductive track at least one zone substantially devoid of the said solder-resist layer; applying to the conductive track in the region of the said zone an adhesive for adhesively bonding the auxiliary conductive element; adhesively bonding the auxiliary conductive element and possible further SMD circuit components to the laminar support; and soldering the auxiliary conductive element and possible further SMD circuit components to the laminar support.

Electronic components can be mounted on the laminar support either on one face or on two faces, there normally being provision for the auxiliary conductive elements to be mounted on a single face together with the other SMD technology circuit components.

In a manner similar to what has been done hitherto in SMD technology, when components are mounted on both faces of the same laminar support, SMD technology circuit components, including the auxiliary conductive elements, will firstly be applied to one face by adhesive bonding. Once application has been done by adhesive, the drying of the adhesive will be carried out in an appropriate oven and there will be provision for the rotation of the support so as to allow mounting of the circuit components on the opposite face, by inserting the legs into the appropriate holes normally provided in the laminar support. Final soldering of the electronic components and of the auxiliary conductive elements, which completes the production cycle, will be carried out by a soldering procedure of known type, for example wave soldering with a tin or similar alloy.

The auxiliary conductive elements are preferably mutually identical so as to achieve the maximum standardisation of the process. However, the use also of different dimensions, or at least of a few different dimensional standards, on the same circuit, is not excluded. These may consist of metal pads of substantially rectangular outline of limited height, and may be produced from copper or some other highly conductive metal or metal alloy and may possibly be coated with a suitable metallic layer which facilitates the adhesive bonding and subsequent soldering. For example, the auxiliary conductive elements may have a forge tinning treatment or the like, with the objective also of preventing oxidation thereof during storage.

To allow automation of the procedure for mounting the auxiliary conductive elements, the invention advantageously provides for them to be loaded in strips of flexible material (for example plastic, cardboard or the like) furnished with a plurality of mutually identical recesses in which the auxiliary conductive elements are housed. These strips have the same structure as the normal loaders of SMD technology components used for mounting systems. It is thus possible to manipulate the auxiliary conductive elements as normal SMD technology components.

Further advantageous characteristics of the process according to the invention, of the printed circuit obtained therewith, and of the strips for loading the auxiliary conductive elements are indicated in the appended claims.

BRIEF DESCRIPTION OF THE DRAWINGS

The invention will be better understood by following the description and the accompanying drawing, which shows a practical non-limiting illustration of the invention. In the drawings are shown.

DESCRIPTION OF THE PREFERRED EMBODIMENTS

Figure 1:
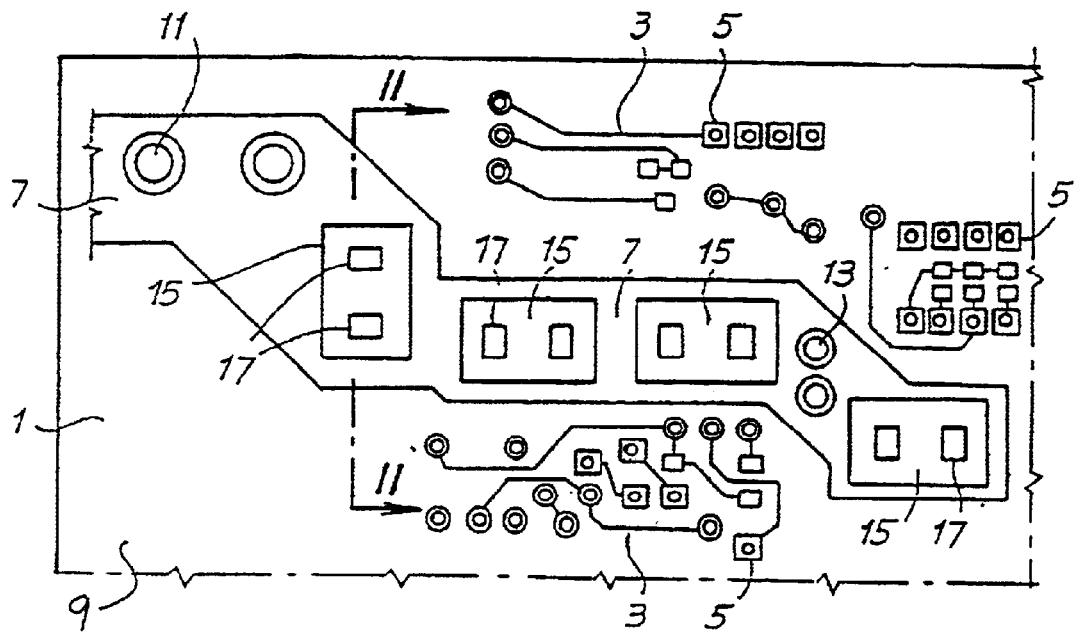
FIG. 1 shows a plan view of a portion of a laminar support with a conductive track prepared for the application of auxiliary conductive elements according to the invention.

FIG. 1 shows, purely as a simplified example, a portion of laminar support board 1 for making printed circuits by the process according to the invention. The laminar support 1 includes electrically conductive tracks 3 and 7 and lands 5. The tracks 3 and 7 can be constructed as small tracks 3 or large tracks 7. The laminar support 1 also includes holes 11 and 13 for mounting electronic components and may be covered by a layer of solder-resist 9. As shown in FIG. 1, the tracks 3 and 7 may include uncovered zones 15 as locations without the layer of the solder resist 9. For one method of the present invention, these zones 15 will include areas 17 which are shown as solder-resist islands 17.

Figure 2:
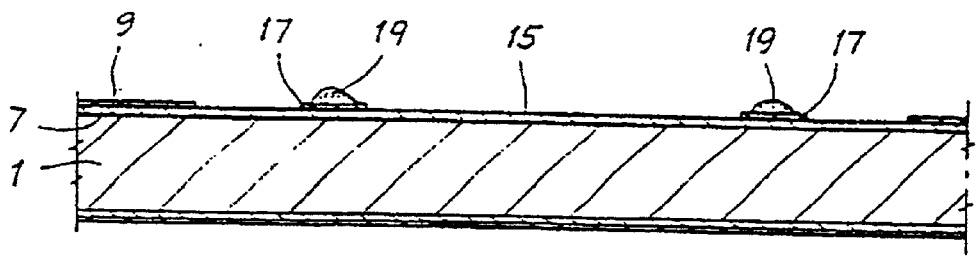
FIGS. 2 through 5 show a greatly enlarged transverse cross-section II—II of the laminar support of FIG. 1 with successive phases of the mounting procedure according to the invention.

FIG. 2 shows a greatly magnified transverse cross-section on II—II of FIG. 1 of the portion of laminar support 1 of FIG. 1. The arrangement of the conductive tracks 3 and 7, of the holes 11 and 13 and of the lands 5 for applying the SMD components is purely random and merely has the objective of facilitating the understanding of the process according to the invention.

The laminar support 1 is made in a well known manner from a lamina of "vetronite", or equivalent material, which on a first face (the one visible in FIG. 1) exhibits a series of tracks 3 and 7 and lands 5 for applying SMD technology circuit components. A conductive track 7 of larger cross-section for connecting power components is also provided on the same face of the laminar support 1. As is known to those skilled in the art, the tracks 3 and 7 and the lands 5 are obtained by printing and etching a copper lamina applied to the laminar support 1 and hence cut to a predetermined design. A layer of protective varnish 9 (see FIG. 2) referred to as "solder-resist" is applied to the area outside of the zones 15 of the tracks 3 and 7 to which electronic components or auxiliary conductive elements are not to be soldered.

In the example depicted, the conductive track 7 is coated with a layer of solder-resist 9 over the whole of its surface with the exception of a series of zones 15 with a substantially rectangular outline. The auxiliary conductive elements 21 (not shown in FIG. 2) will be applied in the region of these zones 15 by the process of the present invention. Each uncovered zone 15 of the track 7 has inside it two limited areas of rectangular outline indicated as solder-resist areas 17 which are shown as islands. In the preferred embodiment, these islands 17 are coated with the layer of solder-resist 9, however, it is possible to utilise the present invention without these areas 17 including the solder-resist 9.

Figure 3:
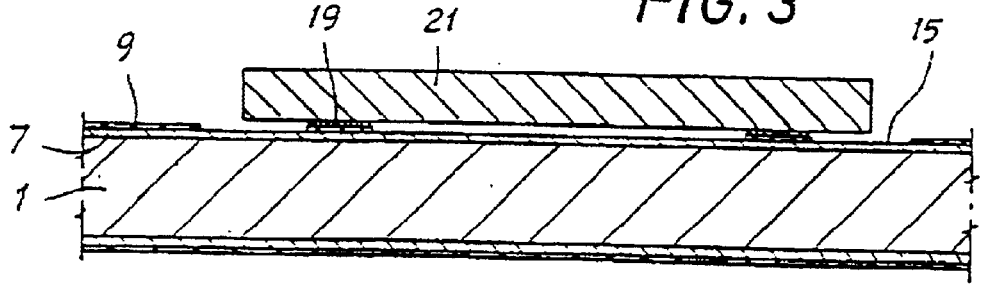

As shown in FIGS. 2 and 3, the mounting of the auxiliary conductive elements 21 is undertaken in the following way. Spots of adhesive 19 are applied to the areas 17 as provided for when mounting SMD technology circuit components. The application of the adhesive 19 and the subsequent application of the auxiliary conductive elements 21 can be effected in the same manufacturing phase wherein the SMD circuit components are adhesively bonded in the region of the lands 5.

Having applied the adhesive 19 to the various areas 17 of the zones 15, an auxiliary conductive element 21, consisting of a metallic pad of substantially rectangular outline and of generally (but not necessarily) smaller dimensions than the dimension of the zone 15, is applied to each zone 15 using a normal SMD technology components mounting system. The mounting of the auxiliary conductive elements 21 on the respective face of the laminar support 1 is effected in the same phase of application of all the SMD technology components 22 to the same face. Having completed this operation, the laminar support 1 is placed in an oven, wherein (as is known in the prior art) the adhesive 19 is dried so as to stabilise the SMD components 22 and the auxiliary conductive elements 21 on the respective face of the laminar support 1.

Figure 4:
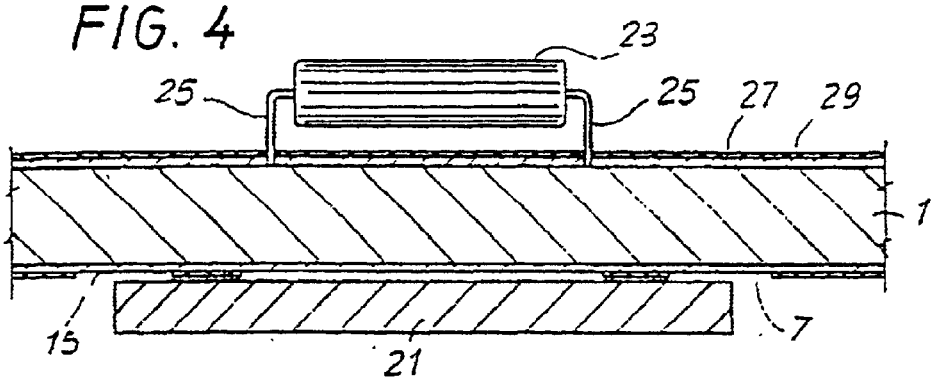

At this point the laminar support 1 is inverted so as to carry out the mounting of the circuit components 23 on the opposite face. Merely by way of illustration, FIG. 4 shows the mounting of a circuit component 23 with respective legs 25 which are inserted into corresponding holes 11 and 13 (not visible in FIG. 4) made in the laminar support 1. The legs 25 are soldered into the holes 11 and 13 with the circuit components 23 located on the opposite face. Conductive tracks 27, suitably covered where necessary with a layer of solder-resist 29, can also made on the face where the circuit components 23 are mounted.

Figure 5:
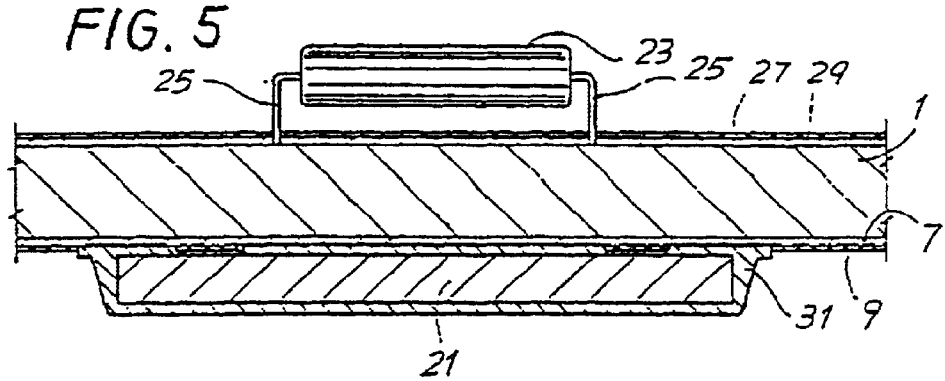

The laminar support 1 is thus furnished with electronic components including circuit components 23, SMD components 22, and auxiliary conductive elements 21 on both faces. The laminar support 1 is then subjected to a series of operations of a type well known to carry out the soldering of the components 21 and 23 and the conductive elements 21. This soldering can be carried out, with prior fluxing if necessary, by means of a wave soldering technique using tin alloy or the like. The final result is shown in FIG. 5. Thus, in addition to the normal soldering of the SMD components 22 to the lower face (in this figure) and of the circuit components 23 furnished with their respective legs 25 to the upper face, the soldering via a layer of tin 31 of the auxiliary conductive elements 21 is also obtained. The tin coats each auxiliary conductive element 21 and also penetrates under it between the surface of the zone 15 of the conductive track 7 and that surface of the conductive element 21 which faces this track. In substance the auxiliary conductive element 21 is "encapsulated" in a coating of tin alloy or some other equivalent solder alloy, which guarantees electrical contact in addition to the adhesion of the element 21 to the printed circuit.

Figure 7:
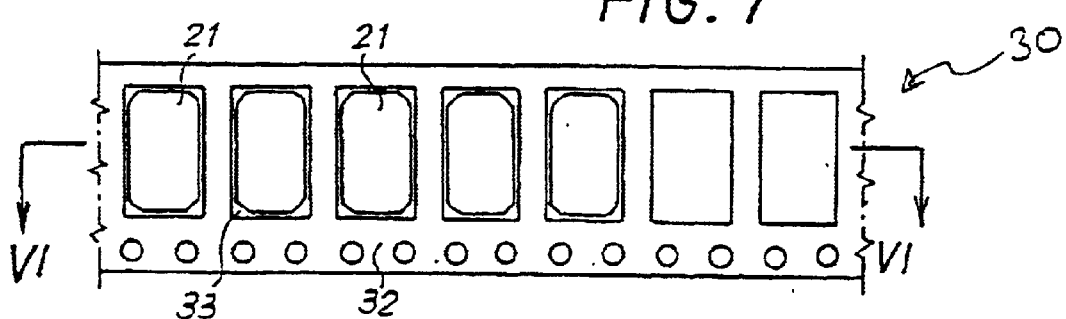
FIGS. 6 and 7 show a longitudinal section through and a plan view of a loading strip for the auxiliary conductive elements.
Figure 6:
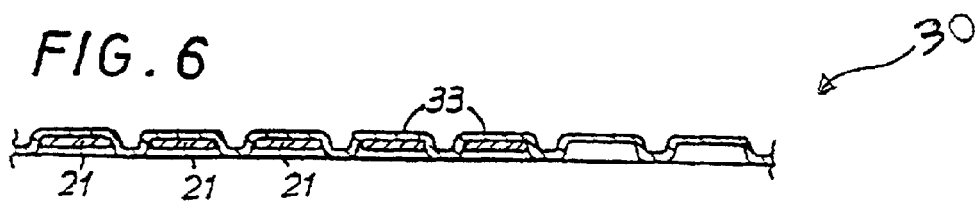

Shown diagrammatically in FIGS. 6 and 7 is a configuration of a loader 30 of auxiliary conductive elements 21 for feeding a machine for mounting SMD technology components. The loader 30 consists of a flexible strip 31 made of plastic or the like, wherein are made recesses 33 in which are seated auxiliary conductive elements 21, in the form of metal pads. The strip 32 is fed to the mounting machine and manipulated by the latter as a normal strip for loading SMD components.

Figure 8:
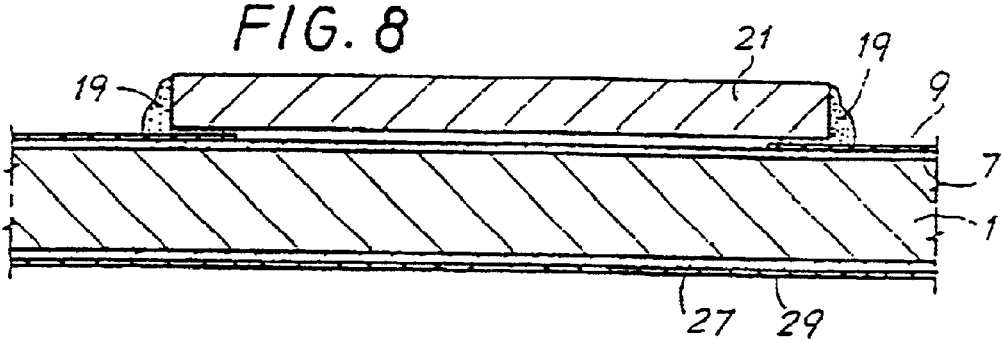
FIGS. 8 to 10 show alternative forms of adhesively bonding the auxiliary conductive element.
Figure 9:
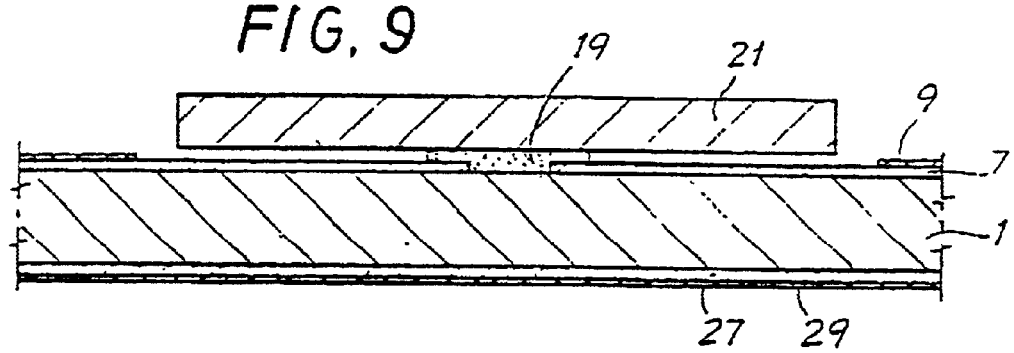
Figure 10:
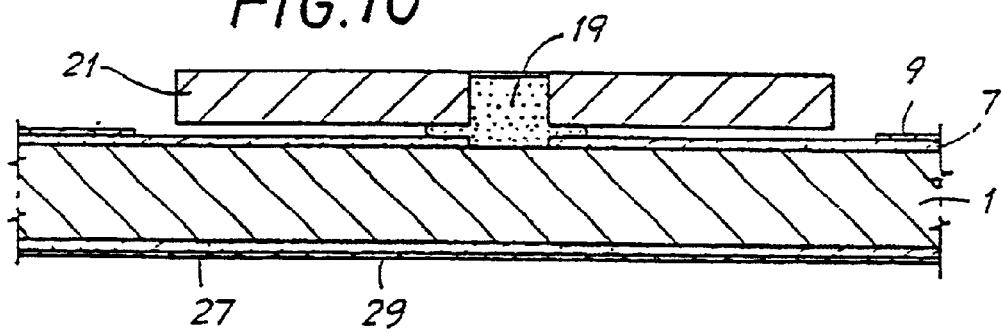

Shown in FIGS. 8 through 10 are three different alternatives for the adhesive bonding of the elements 21 to the laminar support 1. In FIG. 8 the bonding is effected by two spots of adhesive 19 placed in the region of the perimeter of the auxiliary conductive element 21.

In FIG. 9 bonding is effected by a spot of adhesive 19 in the central position, applied directly to the insulating layer 1, having previously removed the conductive lamina.

Shown in FIG. 10 is a modified form of the method of application of FIG. 9, with a central hole in the auxiliary element 21, into which the adhesive 19 penetrates.

In the foregoing reference was made to wave soldering the auxiliary conductive elements 21 and the possible electronic components 22 and 23. However, soldering by different techniques, for example by reflow, in particular when SMD components 22 only are present on the circuit (on one face only or on both), is not excluded.

Figure 11:
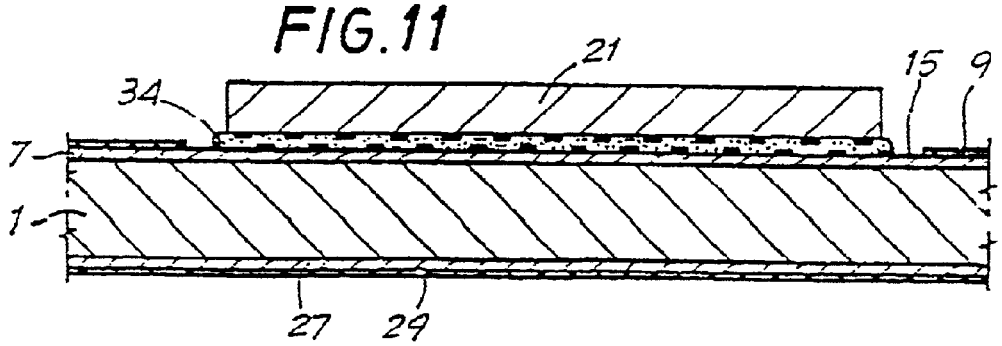
FIG. 11 shows an embodiment with reflow rather than wave soldering.

In FIG. 11 (where identical or corresponding parts are indicated with the same reference numbers), the conductive element 21 is applied to the laminate circuit 1 as described in the following discussion. A cream solder 34 is applied to the soldering lands 15. The preferred method utilises a silk-screen printing method. Then, the auxiliary conductive element 21 is applied with adhesion to the cream solder. Thus, the cream solder acts as a cement in substitution for the cement 19. The circuit is then placed in an infrared or equivalent oven, so as to cause reflow of the cream solder 34.

Other soldering procedures are not excluded.

It is understood that the drawing shows only an illustration given merely as a practical demonstration of the invention, it being possible for this invention to vary in its forms and arrangements without however departing from the scope of the concept underlying the invention. Thus, although there have been described particular embodiments of the present invention of a new and useful Process for Producing Printed Circuits and Printed Circuits thus Obtained, it is not intended that such references be construed as limitations upon the scope of this invention except as set forth in the following claims.

What is claimed is:

1. A circuit apparatus, comprising:
   a laminar support having a thickness, an upper face and an opposed lower face;
   a conductive track on the lower face of the laminar support, the conductive track having a conductive cross-section with an effective capacity to carry electrical power;
   an auxiliary conductive element bonded to and electrically connected to the conductive track on the lower face of the laminar support to increase the conductive cross section of the conductive track and to thereby increase the effective capacity of the conductive track to carry electrical power,
   an electrical component mounted on the upper face of the laminar support opposite the auxiliary conductive element, the electrical component electrically connected through the laminar support to the auxiliary conductive element on the lower face of the laminar support; and
   wherein the auxiliary conductive element is applied by means of an apparatus for applying SMD components.

2. The apparatus of claim 1, wherein the auxiliary conductive element is bonded to the laminar support by means of an adhesive and soldered thereto by a wave soldering procedure.

3. The apparatus of claim 1, wherein the auxiliary conductive element is bonded and electrically connected to the laminar support by means of a cream solder and a reflow soldering procedure.

4. The apparatus of claim 1, wherein the upper face exhibits a plurality of auxiliary conductive elements and a plurality of SMD electronic components mounted thereon, and the lower face exhibits a plurality of electronic components furnished with legs mounted thereon, and the legs pass through the thickness of the laminar support.

5. The apparatus of claim 4, wherein the auxiliary conductive elements are mutually identical.

6. The apparatus of claim 1, wherein the auxiliary conductive element includes a metal pad.

7. The apparatus of claim 1, wherein
   the auxiliary conductive element is electrically connected to the conductive track by a solder alloy; and
   the auxiliary conductive element includes a metal with high electrical conductivity, and
   the auxiliary conductive element is coated with a metallic layer with both high wettability and a melting temperature higher than the melting temperature of the solder alloy.

8. A flexible material strip, comprising;
a plurality of auxiliary conductive elements, each adapted for electrical and mechanical connection to a conductive track formed on a laminar support to thereby increase an effective capacity of the conductive track to carry electrical power; and
a plurality of adjacent recesses formed in the flexible strip, wherein each of the recesses removably houses a respective one of the auxiliary conductive elements; and
wherein the flexible strip comprises a loader strip for a machine for mounting SMD components to the laminar support.

9. The flexible material strip of claim 8, wherein each of the auxiliary conductive elements includes a metal pad.

10. The flexible material strip of claim 8, wherein each auxiliary conductive element comprises a metal with high electrical conductivity and coated with a metallic layer with both a wettability and a melting temperature sufficient for a soldering process.

11. A printed circuit board comprising:
a laminar support having an upper face and an opposed lower face;
at least one conductive track formed on the upper face of the laminar support;
an auxiliary conductive element electrically connected to the conductive track to thereby increase an effective power capacity of the conductive track;
the auxiliary conductive element further comprising a void therein positioned adjacent to the conductive track; and
the auxiliary conductive element is bonded to the conductive track on the upper face of the laminar support by an adhesive, the adhesive at least partially filling the void in the auxiliary conductive element.

12. The printed circuit board of claim 11 further comprising at least one electrical component mounted on the lower face of the laminar support opposite the auxiliary conductive element, the electrical component electrically connected through the laminar support to the conductive track.

* * * * *